United States Patent
Tuominen et al.

(10) Patent No.: US 10,806,027 B2
(45) Date of Patent: Oct. 13, 2020

(54) COMPONENT CARRIER WITH DIFFERENT SURFACE FINISHES

(71) Applicant: AT&S (China) Co. Ltd., Minhang District (CN)

(72) Inventors: Mikael Tuominen, Minhang (CN); Li Ping, Xidu (CN); Ethan Zhou, Kunshan (CN); Karl Wang, Xujing (CN); Giordano-Maria Di Gregorio, Hua Cao Town (CN)

(73) Assignee: AT&S (China) Co. Ltd., Shanghai (CN)

( * ) Notice: Subject to any disclaimer, the term of this patent is extended or adjusted under 35 U.S.C. 154(b) by 220 days.

(21) Appl. No.: 15/397,561

(22) Filed: Jan. 3, 2017

(65) Prior Publication Data

US 2017/0196081 A1  Jul. 6, 2017

(30) Foreign Application Priority Data

Jan. 4, 2016 (CN) ...................... 2016 2 0006287 U

(51) Int. Cl.

| | |
|---|---|
| *B32B 3/00* | (2006.01) |
| *H05K 1/02* | (2006.01) |
| *H05K 1/11* | (2006.01) |
| *B32B 15/04* | (2006.01) |
| *B32B 15/20* | (2006.01) |
| *C23C 28/02* | (2006.01) |
| *H05K 1/09* | (2006.01) |
| *H05K 3/24* | (2006.01) |

(52) U.S. Cl.
CPC ........... *H05K 1/0298* (2013.01); *B32B 15/04* (2013.01); *B32B 15/20* (2013.01); *C23C 28/023* (2013.01); *H05K 1/09* (2013.01); *H05K 1/112* (2013.01); *H05K 3/244* (2013.01); *B32B 2307/202* (2013.01); *B32B 2307/206* (2013.01); *B32B 2457/08* (2013.01); *H05K 2201/0352* (2013.01); *H05K 2203/1476* (2013.01); *Y10T 428/24917* (2015.01)

(58) Field of Classification Search
None
See application file for complete search history.

(56) References Cited

U.S. PATENT DOCUMENTS

| | | | |
|---|---|---|---|
| 6,930,044 B1 * | 8/2005 | Weng ................. | H01L 21/4846 438/671 |
| 2002/0015782 A1 * | 2/2002 | Abys ..................... | H05K 3/062 174/257 |
| 2006/0016779 A1 * | 1/2006 | Miyagawa ............. | H05K 3/243 216/13 |

(Continued)

FOREIGN PATENT DOCUMENTS

EP        0702379    *  3/1996  ............ H01F 27/28

*Primary Examiner* — Seth Dumbris
(74) *Attorney, Agent, or Firm* — Robert A. Blaha; Smith Tempel Blaha LLC

(57) ABSTRACT

A component carrier being less prone to deterioration by oxidation and a method for manufacturing the same are disclosed. The component carrier includes a laminated stack with a first surface finish covering a first part of an exposed surface of the laminated stack and a second surface finish covering a second part of an exposed surface of the laminated stack. The first surface finish and the second surface finish are arranged in direct contact with one another so as to at least partially overlap.

16 Claims, 8 Drawing Sheets

(56) References Cited

U.S. PATENT DOCUMENTS

| | | | |
|---|---|---|---|
| 2006/0204650 A1* | 9/2006 | Hu | C23C 26/00 427/96.1 |
| 2007/0218591 A1* | 9/2007 | Chou | H05K 3/243 438/125 |
| 2008/0296051 A1* | 12/2008 | Yamaguchi | H05K 1/118 174/257 |
| 2009/0109641 A1* | 4/2009 | Ishino | H01L 23/481 361/760 |
| 2011/0012266 A1* | 1/2011 | Horiuchi | H01L 21/561 257/773 |
| 2011/0123930 A1* | 5/2011 | Lin | H05K 3/045 430/311 |
| 2012/0234584 A1* | 9/2012 | Ejiri | H05K 3/244 174/257 |

\* cited by examiner

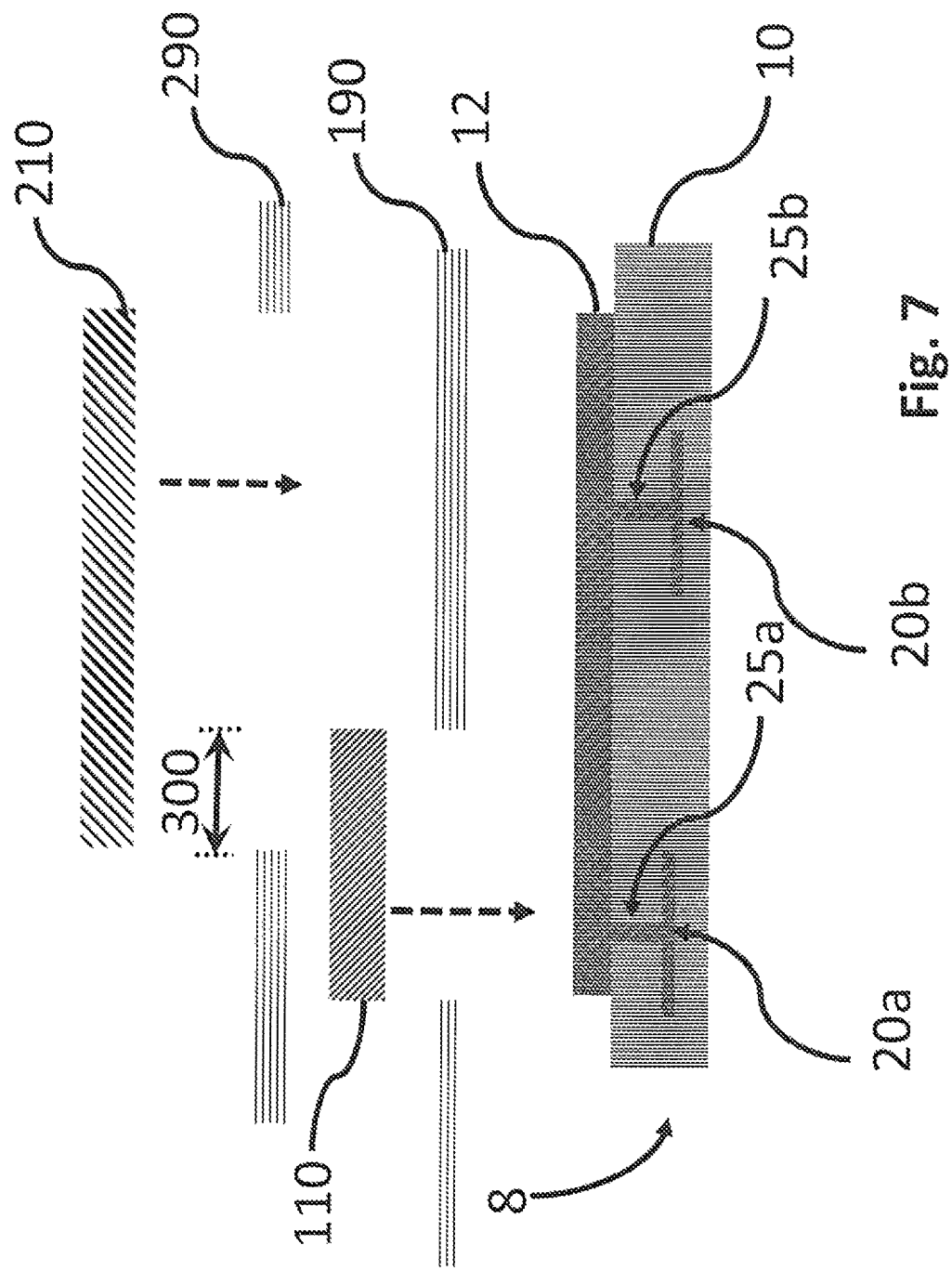

COMPONENT CARRIER WITH DIFFERENT SURFACE FINISHES

This application claims the benefit of the filing date of Chinese utility model Application No. 2016 20006287.3 filed 4 Jan. 2016, the disclosure of which is hereby incorporated herein by reference.

TECHNICAL FIELD

Embodiments of the invention relate to a component carrier, such as a printed circuit board or a substrate, and a method for manufacturing the same.

TECHNOLOGICAL BACKGROUND

A component carrier, such as a printed circuit board (PCB) or a substrate, mechanically supports and electrically connects electronic components. Electronic components are mounted on the component carrier and are interconnected to form a working circuit or electronic assembly.

Component carriers can be single-sided or double-sided component carriers or can have a multi-layer design. Advantageously, multi-layer component carriers allow for much higher component density which becomes nowadays, in times of an ongoing miniaturization of electronic components, more and more important. Conventional component carriers known form the state of the art comprise a laminated stack with a plurality of electrically insulating layer structures and a plurality of electrically conductive layer structures. The electrically conductive layers are usually connected to each other by so called microvias or plated-through holes. A conductive copper layer on the surface of the laminated stack forms an exposed structured copper surface. The exposed structured copper surface of the laminated stack is usually covered with a surface finish which completely covers the exposed structured copper surface.

To provide versatile component carriers capable of carrying electronic components of different types which may be attached to the component carrier by different methods, it is advantageous when the exposed copper surface of the laminated stack is not only covered by a single surface finish but by at least two surface finishes, i.e. a first surface finish for some parts of the exposed copper surface and a second surface finish for other parts of the exposed copper surface.

Even when the process of covering of the exposed structured copper surface of the laminated stack with a surface finish is closely monitored and controlled, tolerance errors occur. Major source of such tolerance errors is the mask used in the image transfer on the component carrier. When plotting masks are used, the placement accuracy of these masks is subject to the accuracy of the device that prints them, the skill of the operator, and the effects of temperature and humidity, which can unevenly distort the material of the mask.

The problem becomes even more severe when more than one surface finish is employed as tolerance errors add up. Then, the inaccuracy of a first surface finish and a second surface finish which are plated adjacent to each other may result in the creation of a non-covered gap between the surface finishes. This non-covered gap is then highly prone to oxidation which in turn may damage the exposed structured copper surface. Tolerances are usually about 20 µm or more for printed circuit boards and about 5 µm or more for substrates (1 µm=1×10$^{-6}$ m). Hence, there is a need for versatile component carriers capable of carrying electronic components of different types being less prone to deterioration in particular by oxidation.

SUMMARY

There may be a need to provide versatile component carriers capable of carrying electronic components of different types being less prone to deterioration in particular by oxidation.

This need may be met by the subject matter according to the independent claims. Advantageous embodiments of the present invention are described by the dependent claims.

According to one aspect there is provided a component carrier comprising (a) a laminated stack with at least one electrically conductive layer structure and at least one electrically insulating layer structure; (b) a first surface finish covering a first part of an exposed surface of the laminated stack; and (c) a second surface finish covering a second part of an exposed surface of the laminated stack wherein the first surface finish and the second surface finish are arranged in direct contact with one another so as to at least partially overlap with each other. Therefore, the creation of a non-covered gap between the surface finishes may be avoided.

OVERVIEW

The term "layer structure" may particularly denote a continuous layer, a patterned layer or a plurality of non-consecutive islands within a common plane.

In the context of the present application, a "metal layer structure" is a layer structure as defined above comprising at least one metal. In addition to at least one metal, a metal layer structure may comprise further metal components and/or non-metal components. In the context of the present application, a nickel layer structure, a gold layer structure, a platinum layer structure and so on may comprise in addition to nickel, gold, platinum, respectively, further metal components and/or non-metal components.

In the context of the present application, the term "metal" is to be construed broadly in a sense that not only elemental metals but also metal alloys, organic metal compounds and that alike are comprised as well.

In the context of the present application, the term "substrate" may particularly denote a component carrier of small size having substantially the same size as an electronic component to be mounted thereon.

In the context of the present application, the term "printed circuit board" (PCB) may particularly denote a plate-shaped component carrier or a plurality of joined plate-shaped component carriers formed by laminating several electrically conductive layer structures with several electrically insulating layer structures, for instance by applying pressure, if desired accompanied by the supply of thermal energy.

Preferably for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them at least partially with electrically conductive material (in particular copper), thereby forming vias as through-hole connections.

Apart from one or more electronic components which may be embedded within a printed circuit board, a printed circuit board is usually configured for accommodating one or more electronic components at one or at both opposing surfaces of the plate-shaped printed circuit board. They may be connected to the respective main surface by soldering.

Electroless nickel plating (EN) is a technique for nickel layer deposition. Electroless plating technologies take advantage of an auto-catalytic reaction in order to deposit a coating on the surface of a component carrier, such as the surface of a PCB or of a substrate. Electroless nickel plating may exhibit advantages over conventional plating methods as electroless plating technologies do not require to pass an electric current through the solution to form a deposit and are therefore free from flux-density and power supply issues. Thus, providing an even and well-defined surface finish. Not only nickel but also other metals, in particular platinum (EP), can be plated by electroless technologies.

In electroless nickel plating, a reducing agent, such as sodium hypophosphite ($NaPO_2H_2.H_2O$), reacts with nickel metal ions to deposit metal. In electroless nickel plating, preferably alloys with different percentage of phosphorus. Different amount of phosphorous may result in different properties of the deposited layer.

The EN plating is usually classified into low phosphorus, medium phosphorous and high phosphorous treatment according to the amount of phosphorous in the deposited layer:

Low phosphorus treatment offers a very uniform thickness which eliminates grinding after plating. Further it provides for excellent corrosion resistance in alkaline environments. The amount of phosphorous is typically below 4 wt.-% of phosphorous in the deposited layer.

Medium phosphorus electroless nickel (MPEN) treatment is referred to the nickel-phosphorus alloy deposited by an electroless/autocatalytic process in which the resulting alloy consists of medium levels of phosphorus. The range of phosphorous is from about 4 to about 10 wt.-% of phosphorous in the deposited layer.

The EN bath is typically composed of a nickel source, for instance nickel sulfate, and a reducing agent, such as sodium hypophosphite. The EN bath may further comprise at least one complexing agent, e.g. for increasing phosphite solubility, and/or at least one stabilizer and/or at least one buffering agent and/or at least one brightener and/or at least one surfactant and/or at least one accelerator. Advantageously, the EN treatment is such that is provides a high speed deposit rate.

High Phosphorus electroless nickel treatment offers high corrosion resistance and protection from acidic environments ensuring very little surface porosity. The amount of phosphorous is above 10 wt.-% of phosphorous in the deposited layer.

In the context of the present application an electroless nickel layer with a phosphorus content in a range of 0.1 wt.-% to 13 wt.-%, more preferred with a phosphorus content in a range of 0.5 wt.-% to 10 wt.-%, and even more preferred with a phosphorus content in a range of 3 wt.-% to 7 wt.-% may be employed. The preferred treatment for obtaining an electroless nickel layer is a medium phosphorus electroless nickel treatment.

It is established in the state of the art that electroless Nickel/Immersion Gold (ENIG) has excellent solderability properties and forms high reliability wire bonds effectively preventing oxidation issues. Further, it is established in the state of the art that electroless Nickel/electroless palladium/Immersion Gold (ENEPIG) has good solderability for Sn—Ag—Cu based solders and forms high reliability wire bonds. Therefore, for realizing the component carrier described in this document known and well established procedures can be employed. As a consequence, the described component carrier can be realized in a technologically easy and reliable manner.

In one embodiment, the component carrier is a laminate-type component carrier. In such an embodiment, the component carrier is a compound of multiple layer structures which are stacked and connected together by applying a pressing force, if desired accompanied by heat treatment.

Preferably the component carrier is shaped as a plate. More preferred, the component carrier is basically shaped as a rectangular plate, whereas parts of the rectangular plate, in particular edges, may be removed by known techniques such as cutting or etching and that alike.

At least one insulating layer structure may comprise at least one of the group consisting of resin, in particular bismaleimide-triazine resin, cyanate ester, glass, in particular glass fibers, prepreg material, polyimide, liquid crystal polymer, epoxy-based build-up Film, FR4 material, a ceramic, and a metal oxide.

The at least one electrically conductive layer structure may comprise at least one of the group consisting of copper, aluminum, and nickel.

According to one aspect there is provided an electronic device comprising at least one component carrier as described above.

The electronic device may comprise a plurality of component carriers, such as printed circuit boards and substrates, which are connected to each other.

In an embodiment, the electronic device comprises adhesive material between at least part of the electronic component and the component carrier. Therefore, the electronic component to be embedded may be glued in place at a desired position within the component carrier thereby ensuring correct positioning of the latter. Selectively, the applied glue may be electrically conductive for simultaneously electrically coupling the embedded component to the environment via the glue, or may be electrically insulating so as to embed the electronic component without undesired electric paths.

The electronic component may be selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip.

The first surface finish and the second surface finish each may have a thickness in a range of 1 nm to 200 µm, more preferred in a range of 5 nm to 150 µm and even more preferred in a range of 10 nm to 100 µm or in a range of 10 nm to 50 µm.

In one embodiment, at least one surface finish comprises a metal layer structure of at least one of the group consisting of nickel, platinum or gold. The gold of a gold layer structure may be hard gold or soft gold. In another embodiment, at least one surface finish comprises at least two metal layer structures of at least one of the group consisting of nickel, platinum or gold. In another embodiment, at least one surface finish comprises at least three metal layer structures of at least one of the group consisting of nickel, platinum or gold.

In another embodiment, the first surface finish comprises at least one metal layer structure of at least one of the group consisting of nickel, platinum and gold and the second surface finish comprises at least one metal layer structure of at least one of the group consisting of nickel, platinum or gold.

In another embodiment, the first surface finish comprises at least two metal layer structures of at least one of the group consisting of nickel, platinum or gold and the second surface finish comprises at least one metal layer structure of at least one of the group consisting of nickel, platinum or gold. In another embodiment, the first surface finish comprises at least two metal layer structures of at least one of the group consisting of nickel, platinum or gold and the second surface finish comprises at least two metal layer structures of at least one of the group consisting of nickel, platinum or gold.

In another embodiment, the first surface finish comprises at least three metal layer structures of at least one of the group consisting of nickel, platinum or gold and the second surface finish comprises at least one metal layer structure of at least one of the group consisting of nickel, platinum or gold. In another embodiment, the first surface finish comprises at least three metal layer structures of at least one of the group consisting of nickel, platinum or gold and the second surface finish comprises at least two metal layer structures of at least one of the group consisting of nickel, platinum or gold. In another embodiment, the first surface finish comprises at least three metal layer structures of at least one of the group consisting of nickel, platinum or gold and the second surface finish comprises at least three metal layer structures of at least one of the group consisting of nickel, platinum or gold.

In another preferred embodiment, the second surface finish comprises a first nickel layer structure and a second gold layer structure. In another preferred embodiment, the second surface finish comprises a first electroplated nickel layer structure and a second gold layer structure.

In another preferred embodiment, the second surface finish comprises a first electroless-plated nickel layer structure and a second gold layer structure. In another even more preferred embodiment, the second surface finish comprises a first electroless-plated nickel layer structure and a second immersion-gold layer structure.

In another preferred embodiment, the first surface finish comprises a gold layer structure. In another preferred embodiment, the first surface finish comprises a first nickel layer structure and a second gold layer structure. In more preferred embodiment, the first surface finish comprises a first nickel layer structure and a second immersion-gold layer structure. In a more preferred embodiment, the first surface finish comprises a first electroless-plated nickel layer structure and a second immersion-gold layer structure.

In a particularly preferred embodiment, the first surface finish comprises a first electroless-plated nickel layer structure and a second immersion-gold layer structure and the second surface finish comprises a first electroplated nickel layer structure and a second gold layer structure.

In a particularly preferred embodiment, the second surface finish comprises a first electroless-plated nickel layer structure and a second immersion-gold layer structure and the first surface finish comprises a gold layer structure.

The various preferred embodiments described above, which relate to the materials of the first surface finish and second surface finish, may provide the advantageous technical effect that a reliable adhesion of the first and the second surface structure is achieved, not only to the electrically conductive layer structure but in particular of the first and the second surface finish to each other in the area of overlap.

In one embodiment the overlap of the first surface finish and the second surface finish is such that the second surface finish is placed on top of the first surface finish.

In another embodiment the overlap of the first surface finish and the second surface finish is such that the first surface finish is placed on top of the second surface finish.

In preferred embodiment, the first surface finish and the second surface finish overlap by at least 1 μm, more preferably by at least 3 μm, yet more preferably by at least 5 μm, yet more preferably by at least 7 μm, yet more preferably by at least 10 μm, yet more preferably by at least 15 μm, yet more preferably by at least 20 μm, yet more preferably by at least 25 μm, and even more preferably by at least 30 μm or by at least 50 μm or by at least 100 μm or by at least 150 μm or by at least 200 μm.

In another embodiment, the component carrier is a substrate. In a more preferred embodiment, the component carrier is a substrate wherein the first surface finish and the second surface finish overlap by at least 1 μm, more preferably by at least 3 μm and yet more preferably by at least 5 μm or by at least 10 μm.

In yet another embodiment the component is a printed circuit board. In a more preferred embodiment, the component carrier is a printed circuit board wherein the first surface finish and the second surface finish overlap by at least 10 μm, more preferably by at least 20 μm, yet more preferably by at least 25 μm and even more preferably by at least 30 μm or by at least 40 μm or by at least 100 μm or by at least 150 μm or by at least 200 μm.

In another embodiment, the first surface finish comprises at least one metal layer structure of at least one of the group consisting of nickel, platinum or gold and the second surface finish comprises at least two metal layer structures of at least one of the group consisting of nickel, platinum or gold and the overlap of the first surface finish and the second surface finish is such that the upper metal layer structure of the at least two metal layer structures of the second surface finish is placed on top of the first surface finish.

In another embodiment, the first surface finish comprises at least one metal layer structure of at least one of the group consisting of nickel, platinum or gold and the second surface finish comprises at least two metal layer structures of at least one of the group consisting of nickel, platinum or gold and the overlap of the first surface finish and the second surface finish is such that the at least two metal layer structures of the at least two metal layer structures of the second surface finish is placed on top of the first surface finish.

Preferably, a gold layer has a thickness of at least 0.01 μm, more preferred of at least 0.05 μm.

Preferably, a gold layer structure has less than 5 wt.-% of impurities, more preferred less than 1 wt.-% of impurities and even more preferred less than 0.1 wt.-% of impurities.

Preferably, a platinum layer structure has a thickness in a range of 0.01 μm to 0.6 μm and more preferred in a range of 0.05 μm to 0.2 μm.

In one embodiment, a platinum layer structure is an electroless platinum layer structure. An electroless platinum layer structure in the context of the application is a platinum layer structure obtained by an electroless plating method Preferably, a electroless platinum layer structure has a phosphorus content in a range of 0.1 wt.-% to 15 wt.-%, more preferred a phosphorus content in a range of 1 wt.-% to 10 wt.-% and even more preferred a phosphorus content in a range of 5 wt.-% to 8 wt.-%.

Preferably, the nickel layer structure has a thickness in a range of 0.01 μm to 50 μm, more preferred in a range of 0.05 μm to 10 μm.

Preferably, an electroless nickel layer structure has a phosphorus content in a range of 0.1 wt.-% to 13 wt.-%, more preferred a phosphorus content in a range of 0.5 wt.-% to 10 wt.-% and even more preferred a phosphorus content in a range of 3 wt.-% to 7 wt.-%.

In a preferred embodiment, the first surface finish and/or the second surface finish comprise at least one non-conductive layer structure. More preferred, at least one non-conductive layer structure forms at least a partial surface or more preferably forms the entire surface of the first and the second surface finish.

According to a further aspect there is provided a method of manufacturing a component carrier according to any of the embodiments of the present application or a combination of the embodiments of the present application. The provided method comprises: (a) Forming a laminated stack comprising at least one electrically conductive layer structure and at least one electrically insulating layer structure; (b) covering a first part of an exposed surface of the laminated stack with a first surface finish; (c) covering a second part of an exposed surface of the laminated stack with a second surface finish; (d) arranging the first surface finish and the second surface finish in direct contact with one another so as to at least partially overlap with each other.

Preferably, covering the first part of an exposed surface of the laminated stack with the first surface finish is done before covering of the second part of an exposed surface of the laminated stack with the second surface finish, wherein the second part of an exposed surface is covered with the second surface finish in such a way that the second surface finish is placed on top of the first surface finish in the area of overlap of the first and the second surface finish.

Preferably covering with the first surface finish is done by using a first mask and the covering with the second surface finish is done by using a second mask such that the second surface finish is placed on top of the first surface finish providing an area of overlap of the second surface finish and the first surface finish.

Preferably the first mask and the second mask employed in the method of manufacturing a component carrier are such that the overlap of the image of the first mask and the second mask are larger than the combined inaccuracies of plating of the first mask and the second mask.

Preferably, the covering of the first surface finish is done by firstly applying an electroless-plated nickel layer structure and secondly applying an immersion-gold layer structure or by only applying a gold layer structure.

The covering of the second surface finish may be realized by firstly applying an electroplated nickel layer structure and secondly applying a gold layer structure or by firstly applying an electroless-plated nickel covering and secondly applying an immersion-gold layer structure.

BRIEF DESCRIPTION OF THE DRAWINGS

FIG. 7 shows a cross-sectional view of a method for manufacturing of a component carrier according to FIG. 3.

DETAILED DESCRIPTION OF ILLUSTRATED EMBODIMENTS

Figure 1:
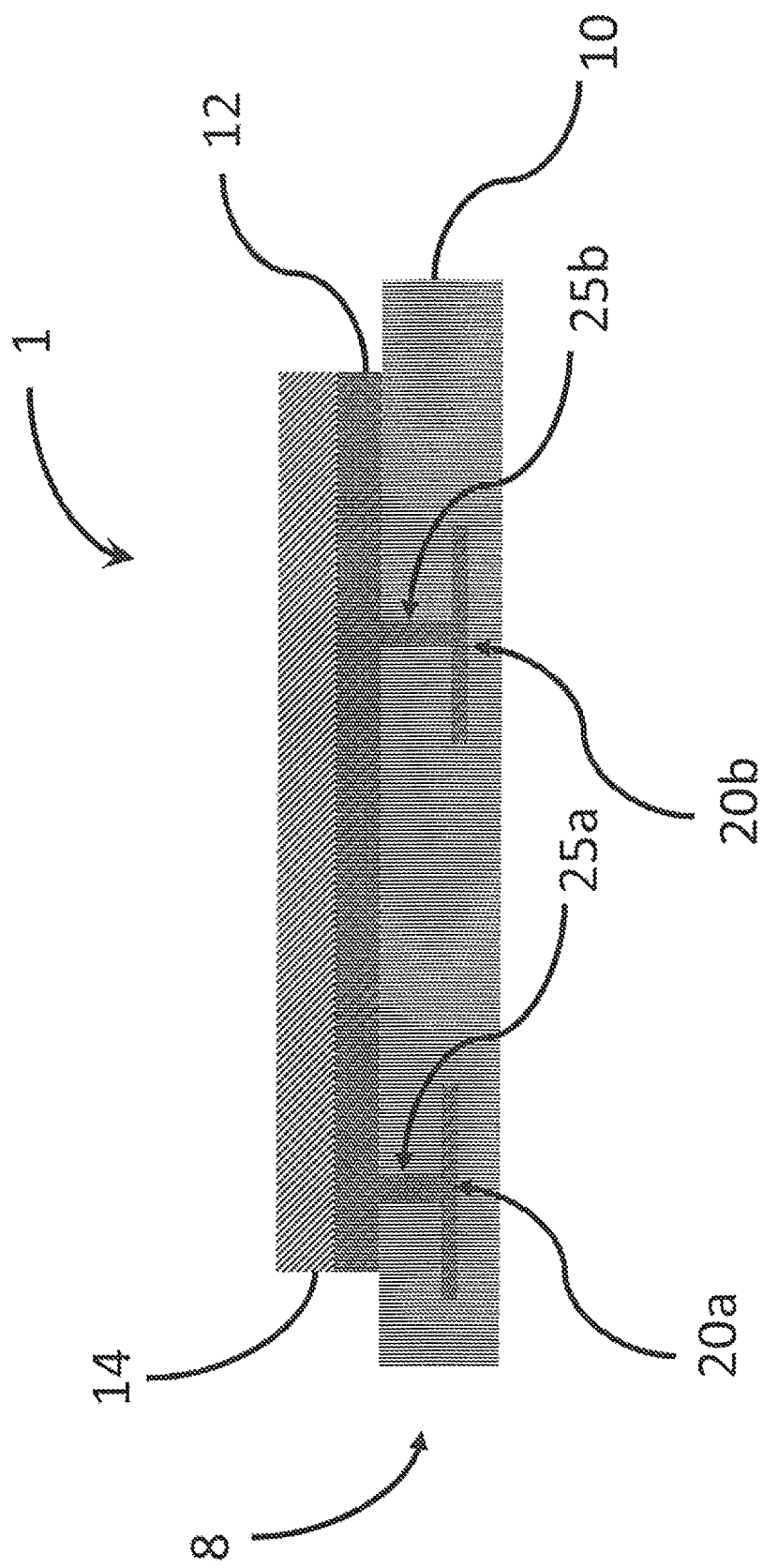
FIG. 1 shows a cross-sectional view of a conventional component carrier known from the state of the art.

The conventional component carrier 1 known from the state of the art and shown in FIG. 1 comprises a laminated stack 8. The laminated stack 8 comprises an electrically insulating layer structure 10 and an electrically conductive layer structure 20a, 20b inside the laminated stack 8 as well as an electrically conductive layer structure 12 on or over the surface of the laminated stack 8 forming an exposed structured copper surface 12. The electrically conductive layer structures 20a, 20b, 12 are preferably made of copper. The electrically conductive layer structure 20a, 20b inside the laminated stack 8 is connected to the electrically conductive layer structure 12 by way of microvias or plated-through holes 25a, 25b. A single surface finish 14 completely covers the electrically conductive layer structure 12.

Figure 2A:
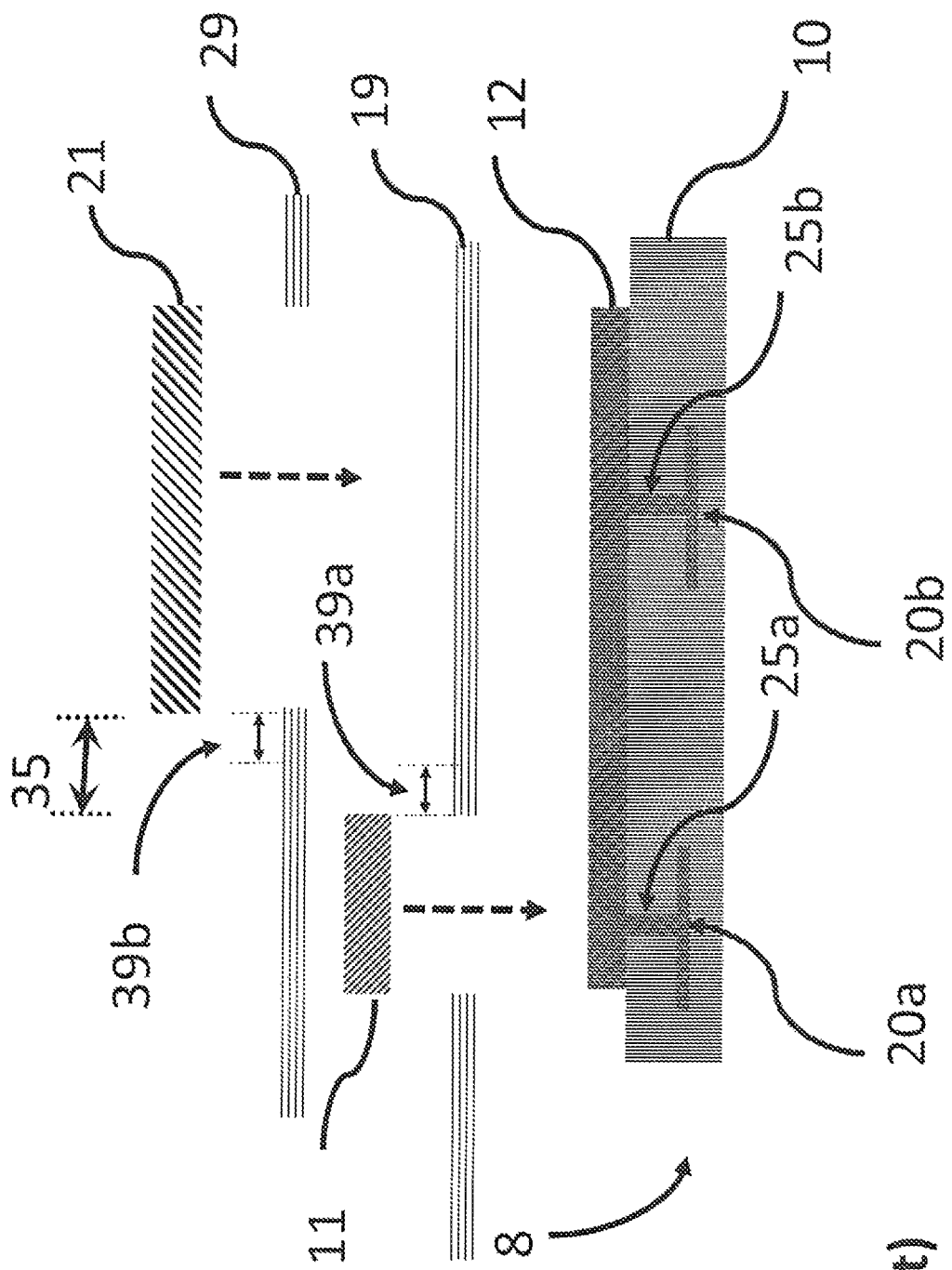
FIG. 2a and FIG. 2b illustrate a known method for manufacturing of a component carrier and the final component carrier, respectively, wherein the combined inaccuracies of plating of a first mask and a second mask result in a gap between a first and a second surface finish.
Figure 2B:
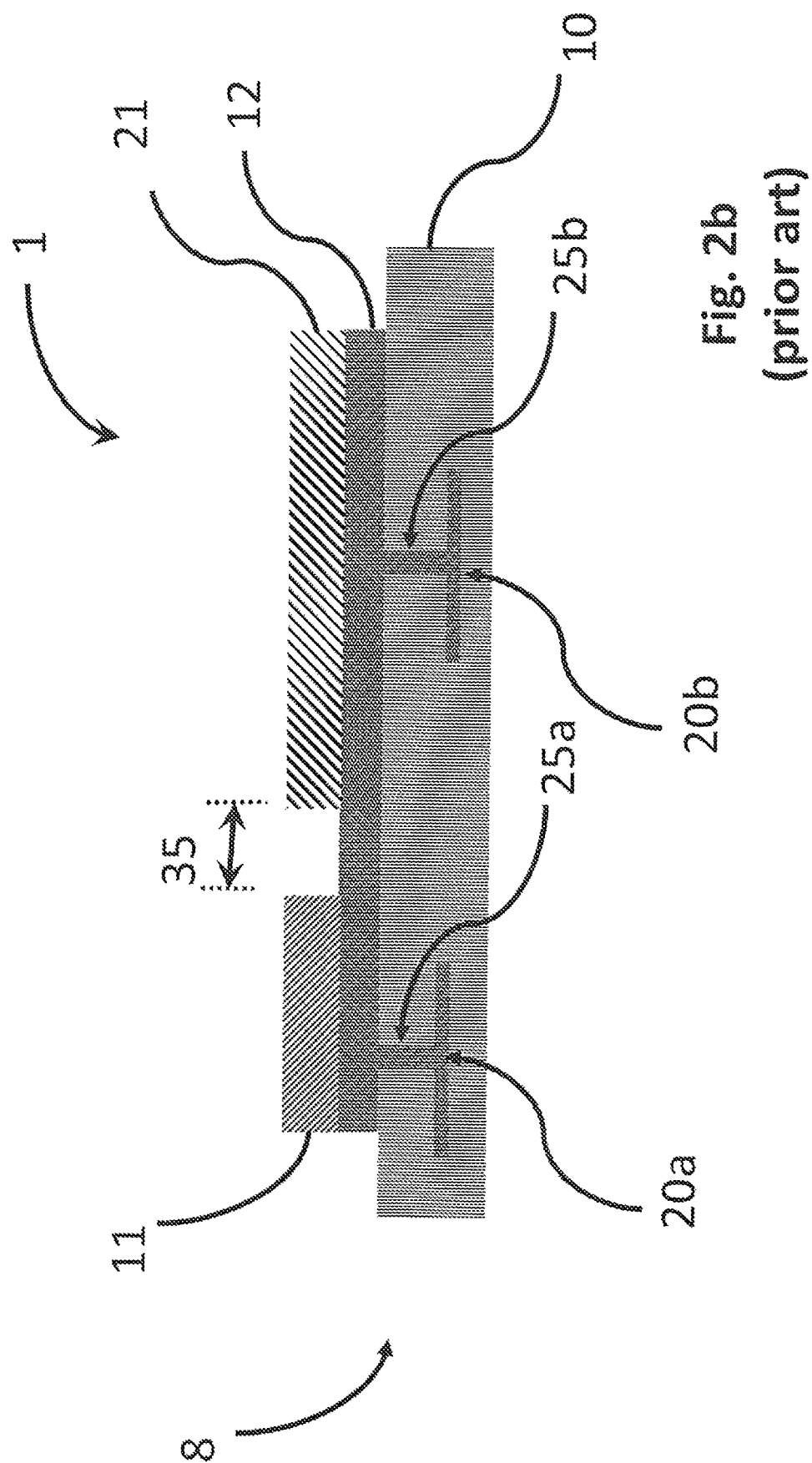

The manufacturing of a known component carrier 1 as shown in FIG. 2a comprises applying a first mask 19 above the electrically conductive layer structure 12, applying a first surface finish 11 in a region not protected by the first mask 19 and then applying a second mask 29 above the first mask 19 and the first surface finish 11. Thereafter, the method continues with the application of a second surface finish 21 in a region unprotected by the second mask 29. The area which is not covered by the mask material corresponds to the image of the mask, enabling the surface finish coming into contact with the exposed surface of the component carrier during plating. The problem arises that the inaccuracy region of plating 39a, 39b of the first surface finish 11 and second surface finish 21, respectively, may result in a non-covered gap or region 35 between the first surface finish 11 and the second surface finish 21 as shown in FIG. 2b. The electrically conductive layer structure 12 (which can be made from copper) is prone to oxidation over the area in registration with non-covered gap or region 35 which may result in damage to the exposed surface.

Figure 3:
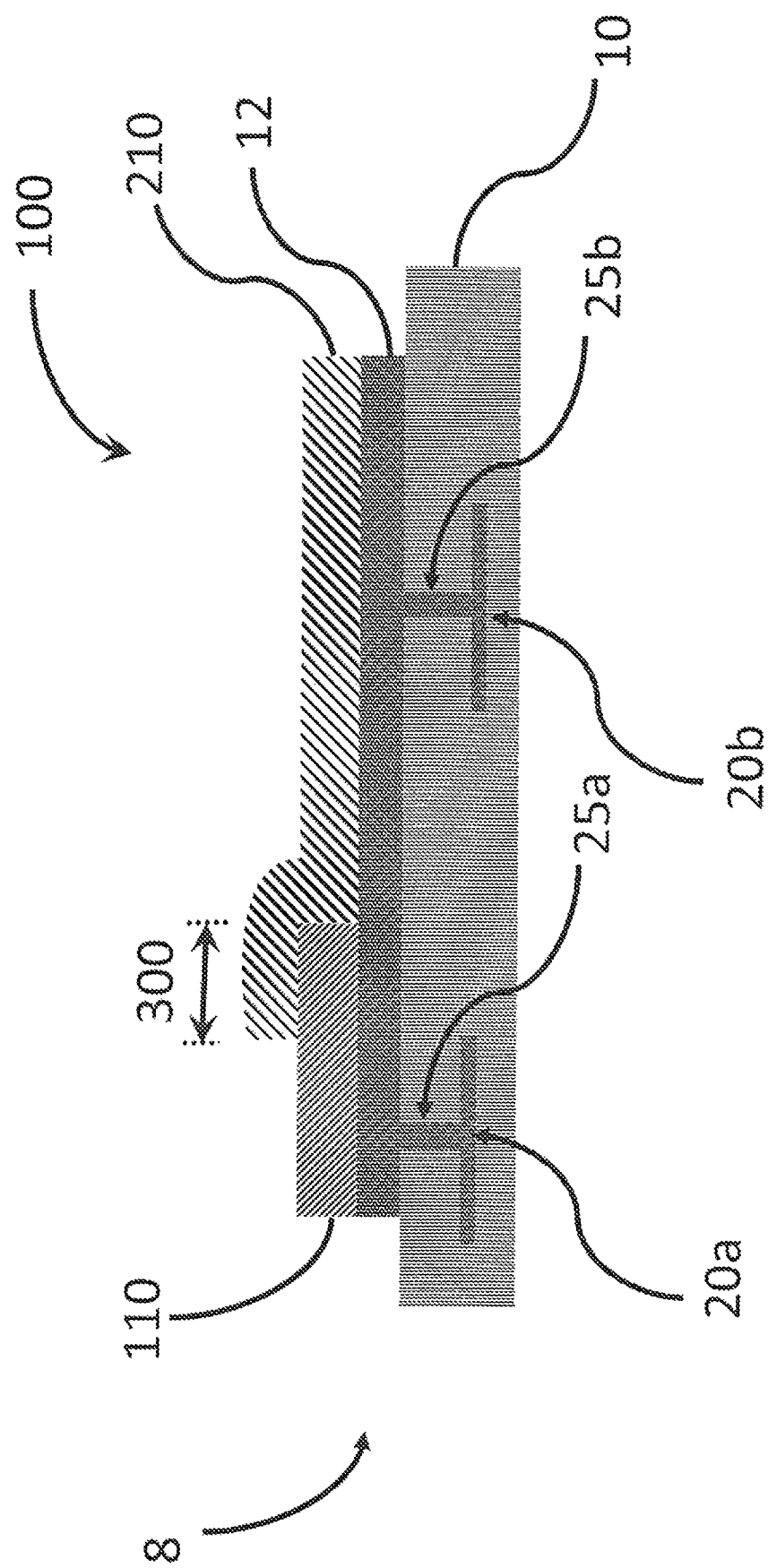
FIG. 3 shows a cross-sectional view of an inventive embodiment of the component carrier according to FIG. 2 with a first and a second surface finish, wherein the first and the second surface finishes partly overlap.

An improved component carrier 100 according to an embodiment of the invention is shown in FIG. 3. As illustrated, the first surface finish 110 and the second surface finish 210 partly overlap. A region 300 where the first surface finish 110 and the second surface finish 210 overlap each other is such that the second surface finish 210 is partly placed on top of the first surface finish 110. Preferably, the first surface finish 110 and the second surface finish 210 overlap each other at least to an extent which exceeds the inaccuracy region (See, e.g. 39a, 39b in FIG. 2a) of plating of the first surface finish 110 and second surface finish 210, in particular by at least 20 μm.

Figure 4:
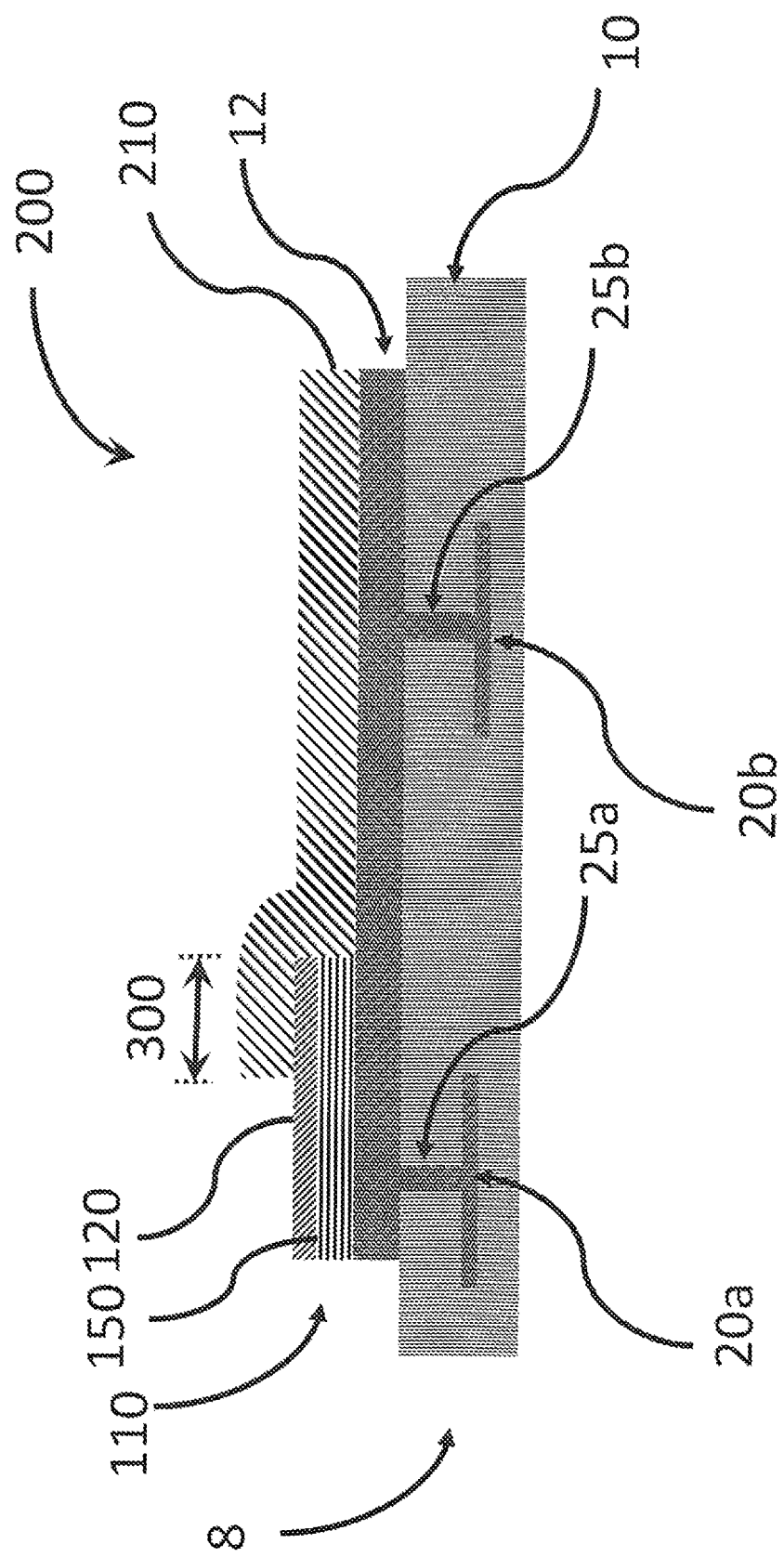
FIG. 4, FIG. 5 and FIG. 6 show cross-sectional views of further embodiments of the inventive component carrier according to FIG. 3.

An improved component carrier 200 according to an alternative embodiment of the invention is shown in FIG. 4. As illustrated, the first surface finish 110 comprises a first layer structure 150 and a second layer structure 120, with the first layer structure 150 being for instance an electroless-plated nickel layer structure and the second layer structure 120 being for instance an immersion-gold layer structure.

Figure 5:
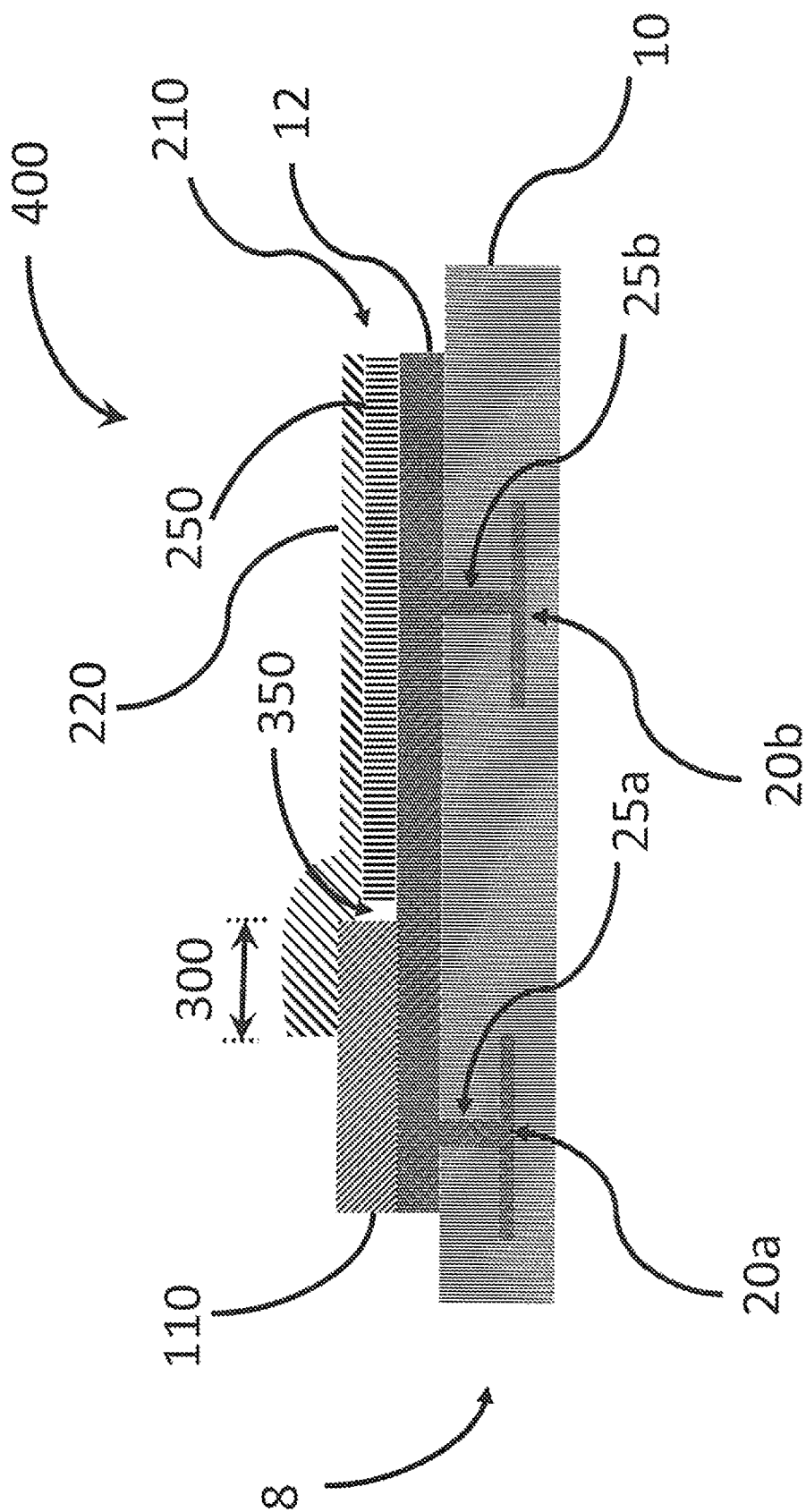

An improved component carrier 400 according to another alternative embodiment of the invention is shown in FIG. 5. As illustrated, the second surface finish 210 comprises a first layer structure 250 and a second layer structure 220, with the first layer structure 250 being for instance an electroplated nickel layer structure and the second layer structure 220 being for instance a gold layer structure. Only the second layer structure 220 of the second surface finish 210 overlaps the first surface finish 110 over the region 300 thereby covering the gap 350 between the first surface finish 110 and the first layer structure 250 and providing protection of the electrically conductive layer structure 12 from oxidation.

Figure 6:
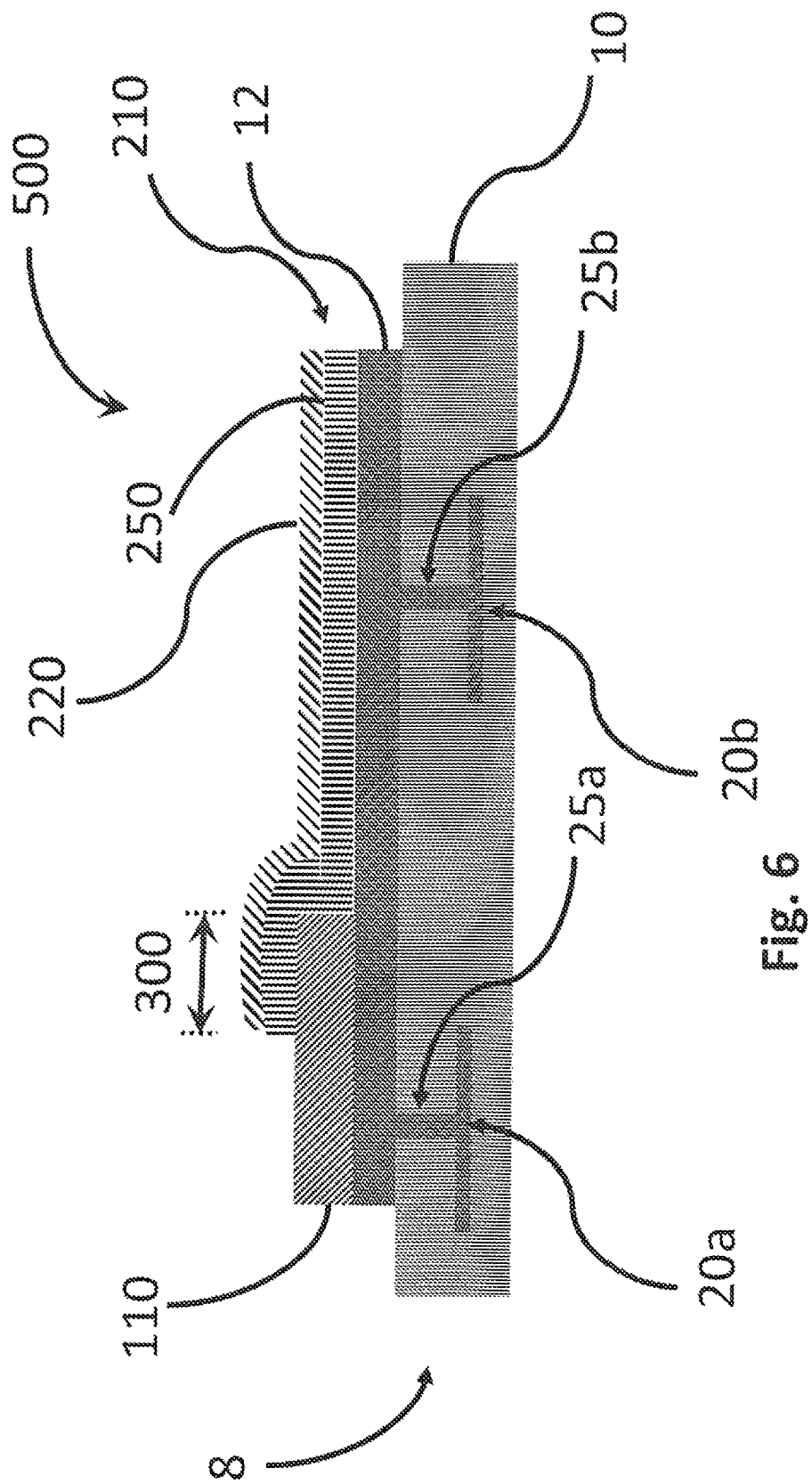

An improved component carrier 500 according to still another alternative embodiment of the invention is shown in FIG. 6. As illustrated, the second surface finish 210 comprises a first layer structure 250 and a second layer structure 220, with the first layer structure 250 being for instance an electroplated nickel layer structure and the second layer structure 220 being for instance a gold layer structure. The first layer structure 250 of the second surface finish 210 as well as the second layer structure 220 of the second surface finish 210 overlap each other and a portion of the first surface finish 110 over the region 300 thereby entirely avoiding gap formation between the first surface finish 110 and the second surface finish 210.

FIG. 7 illustrates a method for manufacturing an improved component carrier according to an embodiment of the invention depicted as for instance in FIG. 3. The method comprises using a first mask 190 for subsequently applying a first surface finish 110 and then using a second mask 290 for subsequently applying a second surface finish 210. The first surface finish 110 and the second surface finish 210 are provided in such a way as to partly overlap each other over the region 300 with the second surface finish 210 being partly placed on top of the first surface finish 110 thereby avoiding oxidation issues of the underlying electrically conductive layer structure 12 due to gap-formation between the first surface finish 110 and the second surface finish 210.

It should be noted that the term "comprising" does not exclude other elements or steps and the indefinite article "a" or "an" does not exclude a plurality of the corresponding features. Elements described in association with different embodiments may be combined.

The invention is not limited to the preferred embodiments shown in the figures and given in the description. Instead, multiplicities of variants are possible which use the solutions shown and the principles according to the invention even in the case of fundamentally different embodiments.

REFERENCES APPLIED IN THE ILLUSTRATED EMBODIMENTS 1 component carrier
8 laminated stack
10 electrically insulating layer structure
11 first surface finish
12 electrically conductive layer structure
14 surface finish
19 first mask
20 electrically conductive layer structure
21 second surface finish
25 microvias or plated-through holes
29 second mask
35 gap
39 plating
100 improved component carrier
110 first surface finish
120 second layer structure
150 first layer structure
190 first mask
200 improved component carrier
210 second surface finish
220 second layer structure
250 first layer structure
290 second mask
300 region
350 gap
400 improved component carrier
500 improved component carrier

The invention claimed is:

1. A component carrier, comprising:
   a laminated stack having at least one electrically conductive layer structure and at least one electrically insulating layer structure;
   a first surface finish covering at least a first part of an exposed surface of the laminated stack; and
   a second surface finish covering at least a second part of an exposed surface of the laminated stack, the first and second parts being not identical;
   wherein the first surface finish and the second surface finish are arranged in direct contact with one another so as to partly overlap with each other, in an overlap, the overlap being not identical to each of the first and second parts of the exposed surface of the laminated stack; wherein
   in a cross-sectional view on the exposed surface, the first part of the exposed surface of the laminated stack and the second part of the exposed surface of the laminated stack are contiguous;
   in the cross-sectional view on the exposed surface, the overlap is defined between an end of the first surface finish and an end of the second surface finish;
   the first surface finish and the second surface finish each have a thickness measured perpendicular to a main surface of the component carrier, and the first part and the second part each have a length of more than 20 µm measured along the main surface of the component carrier, wherein the lengths of each of the first and second parts are larger than the thicknesses of each of the first and second surface finishes, the thicknesses of each of the first and second surface finishes are between 100 nm and 10 µm; and
   the overlap has a length measured along the main surface of the component carrier, wherein the length of the overlap is smaller than the lengths of each of the first and second parts.

2. The component carrier according to claim 1, wherein the overlap of the first surface finish and the second surface finish is such that the second surface finish is placed on top of the first surface finish.

3. The component carrier according to claim 1, wherein the first surface finish and the second surface finish overlap by at least 20 µm.

4. The component carrier according to claim 3, wherein the first surface finish and the second surface finish overlap by at least 100 µm.

5. The component carrier according to claim 1, wherein the exposed surface of the laminated stack is a structured copper surface.

6. The component carrier according to claim 1, wherein the first surface finish and the second surface finish each comprises at least one metal layer structure.

7. The component carrier according to claim 6, wherein the at least one metal layer structure comprises at least one of the group consisting of nickel, platinum and gold.

8. The component carrier according to claim 1, wherein the second surface finish comprises a first electroplated nickel layer structure and a second gold layer structure.

9. The component carrier according to claim 1, wherein the second surface finish comprises a first electroless-plated nickel layer structure and a second immersion-gold layer structure.

10. The component carrier according to claim 1, wherein the first surface finish comprises a gold layer structure.

11. The component carrier according to claim 1, wherein the first surface finish comprises a first electroless-plated nickel layer structure and a second immersion-gold layer structure.

12. The component carrier according to claim 1, wherein at least one surface finish comprises at least three plated metal layer structures.

13. The component carrier according to claim 11, wherein at least one surface finish comprises a first nickel layer structure, a second platinum layer structure and a third gold layer structure.

14. The component carrier according to claim 1, wherein the component carrier is a printed circuit board.

15. The component carrier according to claim 1, wherein the component carrier is a substrate.

16. An electronic device, comprising:
a laminated stack having at least one electrically conductive layer structure and at least one electrically insulating layer structure;
a first surface finish covering at least a first part of an exposed surface of the laminated stack; and
a second surface finish covering at least a second part of an exposed surface of the laminated stack, the first and second parts being not identical;
wherein the first surface finish and the second surface finish are arranged in direct contact with one another so as to partly overlap with each other in an overlap, the overlap being not identical to each of the first and second parts of the exposed surface of the laminated stack; wherein
in a cross-sectional view on the exposed surface, the first part of the exposed surface of the laminated stack and the second part of the exposed surface of the laminated stack are contiguous;
in the cross-sectional view on the exposed surface, the overlap is defined between an end of the first surface finish and an end of the second surface finish;
the first surface finish and the second surface finish each have a thickness measured perpendicular to a main surface of the component carrier, and the first part and the second part each have a length measured along the main surface of the component carrier, wherein the lengths of each of the first and second parts are larger than the thicknesses of each of the first and second surface finishes, the thicknesses of each of the first and second surface finishes are between 100 nm and 10 µm; and
the overlap has a length measured along the main surface of the component carrier, wherein the length of the overlap is smaller than the lengths of each of the first and second parts.

* * * * *